US006188162B1

(12) United States Patent
Vennerbeck

(10) Patent No.: US 6,188,162 B1
(45) Date of Patent: Feb. 13, 2001

(54) HIGH POWER MEGASONIC TRANSDUCER

(75) Inventor: Richard B. Vennerbeck, San Jose, CA (US)

(73) Assignee: Product Systems Incorporated, Campbell, CA (US)

( * ) Notice: Under 35 U.S.C. 154(b), the term of this patent shall be extended for 0 days.

(21) Appl. No.: 09/384,947

(22) Filed: Aug. 27, 1999

(51) Int. Cl.[7] .......... H01L 41/08
(52) U.S. Cl. .......... 310/334; 310/337; 310/364
(58) Field of Search .......... 310/334–337, 310/363, 364

(56) References Cited

U.S. PATENT DOCUMENTS

| | | | | |
|---|---|---|---|---|
| 3,042,550 | * | 7/1962 | Allen et al. | 310/364 X |
| 3,329,408 | * | 7/1967 | Branson | 310/334 X |
| 3,590,467 | | 7/1971 | Chase et al. . | |
| 3,702,448 | * | 11/1972 | Boblett | 310/334 X |
| 3,747,173 | | 7/1973 | Lind . | |
| 3,765,750 | | 10/1973 | Butter . | |
| 3,798,746 | | 3/1974 | Alphonse et al. . | |
| 4,118,649 | * | 10/1978 | Shwartzman et al. | 310/337 |
| 4,297,607 | | 10/1981 | Lynnworth et al. . | |
| 4,538,466 | | 9/1985 | Kerber . | |
| 4,782,701 | | 11/1988 | Proctor . | |
| 4,804,007 | | 2/1989 | Bran | 134/1 |
| 4,869,278 | | 9/1989 | Bran | 134/184 |
| 4,930,676 | | 6/1990 | McNaught et al. . | |
| 4,998,549 | | 3/1991 | Bran | 134/184 |
| 5,037,481 | | 8/1991 | Bran | 134/1 |
| 5,119,840 | * | 6/1992 | Shibata | 310/334 X |
| 5,247,954 | | 9/1993 | Grant et al. | 134/184 |
| 5,325,012 | | 6/1994 | Sato et al. . | |
| 5,355,048 | | 10/1994 | Estes | 310/334 |
| 5,465,897 | | 11/1995 | Dixon et al. | 228/121 |
| 5,732,706 | | 3/1998 | White et al. . | |
| 5,898,255 | | 4/1999 | Kishima et al. . | |

FOREIGN PATENT DOCUMENTS

WO 97/34528 9/1997 (WO) .

* cited by examiner

*Primary Examiner*—Mark O. Budd
(74) *Attorney, Agent, or Firm*—Donald J. Pagel

(57) ABSTRACT

A megasonic transducer comprised of a stainless steel plate attached to a piezoelectric crystal by an indium attachment layer. To facilitate the attachment, a chromium layer and a silver layer are positioned between the stainless steel plate and the indium layer. Similarly, silver and chromium layers are positioned between the indium layer and the piezoelectric crystal.

16 Claims, 2 Drawing Sheets

HIGH POWER MEGASONIC TRANSDUCER

BACKGROUND OF THE INVENTION

1. Technical Field

The present invention relates to transducers used in transmitting acoustic energy, and more particularly to megasonic transducers attached to an energy transmitting means using indium.

2. Background Information

It is well-known that sound waves in the frequency range of 0.4 to 2.0 megahertz (MHz) can be transmitted into liquids and used to clean particulate matter from damage sensitive substrates. Since this frequency range is predominantly in the megahertz range, the cleaning process is commonly referred to as megasonic cleaning. Among the items that can be cleaned with this process are semiconductor wafers in various stages of the semiconductor device manufacturing process, disk drive media, flat panel displays and other sensitive substrates.

Megasonic acoustic energy is generally created by exciting a crystal with radio frequency AC voltage radiation. The acoustical energy generated by the crystal is passed through an energy transmitting member and into the cleaning fluid. Frequently, the energy transmitting member is a wall of the vessel that holds the cleaning fluid. The crystal and its related components are referred to as a megasonic transducer. For example, U.S. Pat. No. 5,355,048, discloses a megasonic transducer comprised of a piezoelectric crystal attached to a quartz window by several attachment layers. The megasonic transducer operates at approximately 850 KHz. Similarly, U.S. Pat. No. 4,804,007 discloses energy transmitting members in a megasonic transducer comprised of quartz, sapphire, boron nitride, stainless steel and tantalum.

A problem with megasonic transducers of the prior art is that the acoustic power that can be generated by the megasonic transducer in the cleaning solution is limited to about 10 watts per $cm^2$ of active piezoelectric surface without supplying additional cooling to the transducer. For this reason, most megasonic power sources have their output limited, require liquid or forced air cooling or are designed for a fixed output to the piezoelectric transducer or transducers. Typically, fixed output systems are limited to powers of 7–8 watts/$cm^2$. This limits the amount of energy that can be transmitted to the cleaning solution. If more power is applied to the transducer, the crystal can heat up to the point where it becomes less effective at transmitting energy into the cleaning solution. This is caused either by nearing the maximum operating temperature of the crystal or, more often, by reaching the failure temperature of the material used to attach the crystal to the energy transmitting means.

Another problem with prior art cleaning systems that utilize megasonic transducers, is that there is no practical way of replacing a defective transducer once the transducer has been attached to the cleaning system. This means that users have to incur large expenses to replace defective transducers, for example by purchasing a whole new cleaning vessel.

BRIEF SUMMARY OF THE INVENTION

Briefly, the present invention is a megasonic transducer comprised of a piezoelectric crystal attached to an energy transmitting means by a layer of indium. The energy transmitting means transmits acoustic energy generated by the piezoelectric crystal into a cleaning solution. Because indium is very efficient at transmitting acoustic energy from the piezoelectric crystal to the energy transmitting means, more acoustic energy is delivered into the cleaning solution. This efficient transfer of acoustic energy allows higher power densities to be applied to the piezoelectric crystal, thereby decreasing the time needed for a cleaning cycle.

In order to complete the attachment of the energy transmitting means to the piezoelectric crystal using indium, a number of additional materials must be used. Specifically, the megasonic transducer comprises an energy transmitting member and a piezoelectric crystal having a front surface that faces the energy transmitting member and a back surface that faces away from the energy transmitting member. An attachment layer comprised of indium is positioned between the energy transmitting member and the piezoelectric crystal for attaching the piezoelectric crystal to the energy transmitting member, with the attachment layer having a first surface facing the energy transmitting member and a second surface facing the piezoelectric crystal.

A first metal layer is positioned between the first surface of the attachment layer and the energy transmitting member. A second metal layer is positioned between the second surface of the attachment layer and the piezoelectric crystal. A first blocking means for preventing the energy transmitting means from forming an alloy with the first metal layer is positioned between the first metal layer and the energy transmitting member. A third metal layer is positioned in contact with the back surface of the piezoelectric crystal. A fourth metal layer deposited on the front surface of the piezoelectric crystal, and a second blocking layer positioned between the attachment layer and the fourth metal layer.

DETAILED DESCRIPTION OF THE INVENTION

Figure 1:
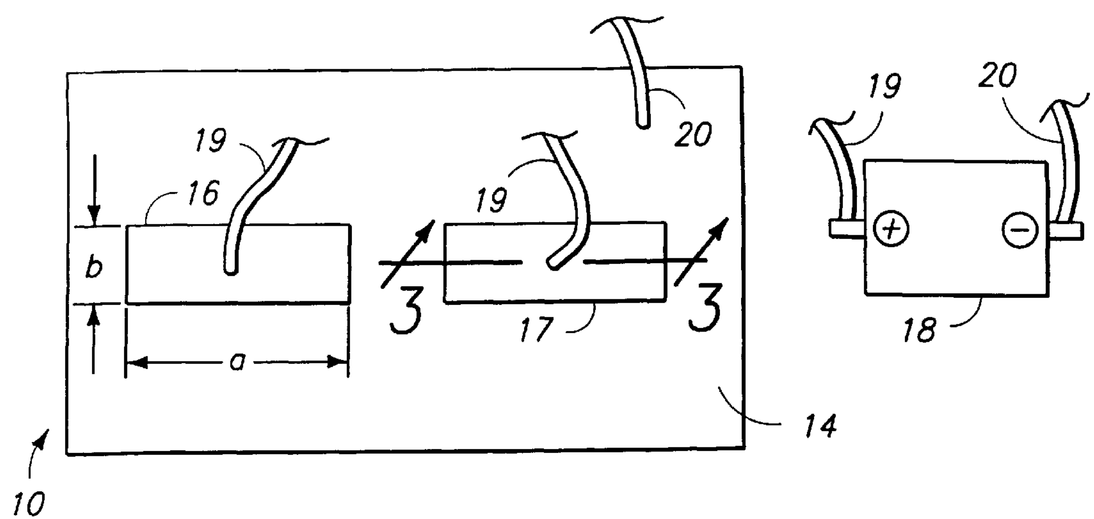
FIG. 1 is a bottom view of a megasonic cleaning apparatus according to the present invention.

FIG. 1 illustrates a cleaning apparatus 10 comprised of a bottom side 14, a first megasonic transducer 16 and a second megasonic transducer 17. The megasonic transducers 16 and 17 are similar to each other. Preferably, the transducers 16 and 17 are positioned on the bottom side 14, although they could also be positioned on other sides of the apparatus 10 or at other positions, such as inside of the apparatus 10. In FIG. 1, the transducers 16 and 17 are illustrated as being rectangular in shape with a length "a" and a height "b". However, other geometric shapes for the transducers 16 and 17 can be used, such as squares, trapezoids, parallelograms, circles and spherical or hemispherical shapes. Similarly, the piezelectric crystal within the transducers 16 and 17 can have any of these shapes.

A radiofrequency generator 18 supplies a voltage to a pair of leads 19 and 20. In FIG. 1, the polarity of the lead 19 is shown as positive and the polarity of the lead 20 is shown as negative, but these can be reversed. The lead 20 is connected to the bottom surface 14 (assuming the conditions described below), and the lead 19 is connected to a part of the transducer 16 (and 17) as is explained below. FIG. 1 illustrates a case where two transducers 16 and 17 are used.

This is an arbitrary number. In other applications, one megasonic transducer could be used or more than two megasonic transducers could be used (See FIG. 2 below). In some situations, an array of sixteen or more megasonic transducers is preferable.

Figure 2:
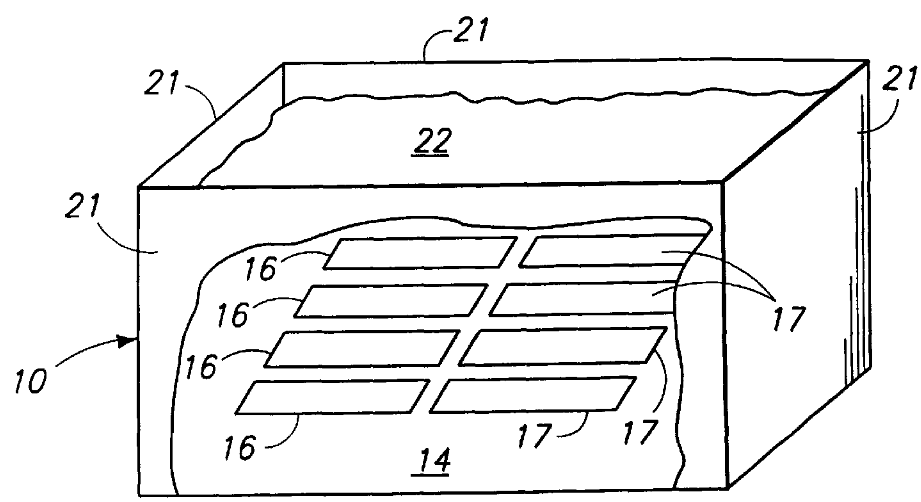
FIG. 2 is a side isometric view of the megasonic cleaning apparatus according to the present invention.

FIG. 2 illustrates that the apparatus 10 includes a plurality of sides 21 that are perpendicular to the bottom side 14. In use, the apparatus 10 is filled with a cleaning fluid 22, such as deionized water (DI water), SC1 (DI water, $NH_4OH$ and $H_2O_2$ in a ration of 5:1:1), or SC2 (DI water, HCl and $H_2O_2$ in a ration of 5:1:1) although other dilution ratios and other aqueous cleaning fluids can be used. Additionally, FIG. 2 illustrates a case where a plurality of the transducers 16 and 17 are used.

Figure 3:
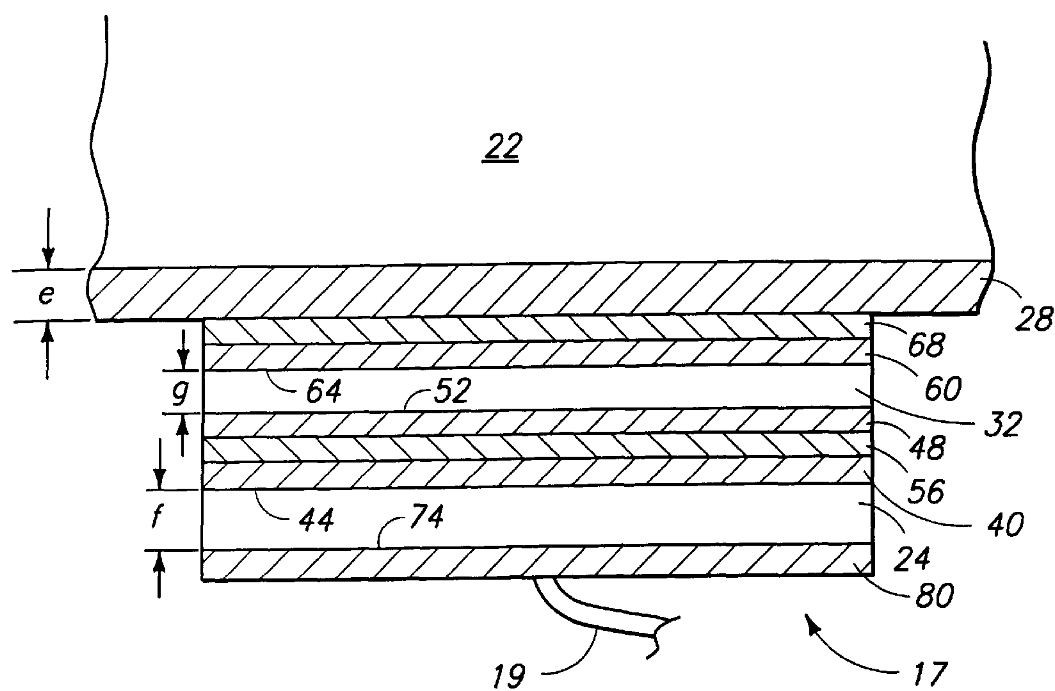
FIG. 3 is a cross-sectional view taken along the line 3—3 of FIG. 1.

FIG. 3 illustrates that the megasonic transducer 17 (and 16) comprises a piezoelectric crystal 24 that is attached to an energy transmitting member 28 by an indium layer 32. In the preferred embodiment, a plurality of other layers are disposed between the piezoelectric crystal 24 and the energy transmitting member 28 to facilitate the attachment process. Specifically, a metal layer 40 is present on a front surface 44 of the piezoelectric crystal 24. Another metal layer 48 is present adjacent to the back surface 52 of the indium layer 32. A blocking layer 56 is positioned between the metal layers 40 and 48 to prevent alloying of the indium layer 32 with the metal layer 40. In the preferred embodiment, the blocking layer 56 comprises a chromium-nickel alloy, and the metal layers 40 and 48 comprise silver. The blocking layer 56 has a minimum thickness of approximately 0.5 microns and the metal layers 40 and 48 have thicknesses of approximately two microns.

In the preferred embodiment, the piezoelectric crystal 24 is comprised of lead zirconate titanate (PZT). However, the piezoelectric crystal 24 can be comprised of many other piezoelectric materials such as barium titanate, quartz or polyvinylidene fluoride resin (PVDF), as is well-known in the art. In the preferred embodiment, each megasonic transducer 17 (or 16) includes one individually excited piezoelectric crystal 24.

A metal layer 60 is in contact with a front surface 64 of the indium layer 32. A blocking/adhesion layer 68 separates the metal layer 60 from the energy transmitting member 28. In the preferred embodiment., the blocking/adhesion layer 68 comprises a layer of nickel chromium alloy which is approximately 15,000 Å thick. However, other materials and/or thicknesses could also be used as the blocking layer 68. For example, the blocking layer 68 could be comprised of a nickel-chrome-iron alloy. The function of the blocking layer 68 is to prevent the metal layer 60 from forming an alloy with the energy transmitting member 28 and to provide an adhesion layer for the metal layer 60. In the preferred embodiment, the metal layer 60 comprises silver and has a thickness in the range of approximately 5000 to 6000 Å. However, other metals and/or thicknesses could be used for the metal layer 60. For example, the metal layer 60 could be comprised of nickel. The function of the metal layer 60 is to provide a wetting surface for the molten indium.

In the preferred embodiment, the indium layer 32 comprises pure indium (99.99%) such as is commercially available from Arconium or Indalloy. However, Indium alloys containing varying amounts of impurity metals can also be used, albeit with less satisfactory results. The benefit of using pure indium and its alloys is that indium possesses excellent shear properties that allow dissimilar materials with different coefficients of expansion to be attached together and experience thermal cycling without damage to the attached materials.

In the preferred embodiment, the energy transmitting member 28 is a piece of stainless steel. Preferably, the bottom side 14 is comprised of stainless steel, so the bottom side 14 is the energy transmitting member 28. Preferably, stainless steel (steel/chromium alloy) having the grade designation 316 comprises the energy transmitting member 28. However, other grades of stainless steel, such as stainless steel in the 300 series (316L, 303 and 304), and other materials, such as tantalum, aluminum, silica compounds, such as quartz, ceramics and plastics, can also function as the energy transmitting member 28. The purpose of the energy transmitting member 28 is to separate (isolate) the piezoelectric crystal 24 from the fluid 22, so that the fluid does not damage the crystal 24. Thus, the material used as the energy transmitting member 28 is usually dictated, at least in part, by the nature of the fluid 22. The energy transmitting member 28 must also be able to transmit the acoustic energy generated by the crystal 24 into the fluid 22.

In the preferred embodiment, the energy transmitting member 28 has a thickness "e" which is preferably a multiple of one-half of the wavelength of the acoustic energy emitted by the piezoclectric crystal 24, so as to minimize reflectance problems. For example, "e" is approximately three millimeters for stainless steel and acoustic energy of about 925 KHz. This relationship is stated by equation 1 below:

$$\lambda = v_L/2f \tag{1}$$

where, $v_L$=the velocity of sound in the energy transmitting member 28 (in mm/msec), f=the natural frequency of the piezoelectric crystal 24 (in MHz)

$\lambda$=the wavelength of acoustic sound in the transmitting member 28.

An additional layer is also disposed on a back side 74 of the piezoelectric crystal 24. Specifically, a metal layer 80 is positioned on the back side 74 of the piezoelectric crystal 24 and covers substantially all of the surface area of the back side 74 of the crystal 24. Generally, the layer 80 is applied to the piezoelectric crystal 24 by the manufacturer of the crystal. The layer 80 functions to conduct electricity from the lead 19, so as to set up a voltage across the crystal 24. Preferably, the metal layer 80 comprises silver, nickel or another electrically conductive layer. In some situations, a protective coating, such as a plastic or a ceramic material, can be positioned over the metal layer 80. This would be done, for example, to keep the layer 80 from electrically shorting outs such as in situations where it might be exposed to liquids.

The purpose of the electrical leads 19 and 20 is to create a voltage difference across the piezoelectric crystal 24 so as to excite it at the frequency of the RF voltage supplied by the RF generator 18. The electrical lead 19 connects the metal layer 80 to the RF generator 18 The electrical lead 20 connects the energy transmitting member 28 to the RF generator 18. Note that if the energy transmitting member 28 is not electrically conductive, then the lead 20 must be connected to the metal layer 60 or some other conductive point adjacent to the face 44 of piezoelectric crystal 24. Also, all of the layers disposed between the energy transmitting member 28 and the piezoelectric crystal 24 must be electrically RF conductive so that the voltage difference across the piezoelectric crystal 24 can be set up by the leads 19 and 20. The RF generator 18 delivers a RF alternating current to the piezoelectric crystal 24 via the leads 19 and 20. Preferably, this is a 925 KHz signal, at 600 watts of power. The effective power in the piezoelectric crystal 24 is approximately 15 watts/$cm^2$. The effective power in the piezoelectric crystal 24 is defined as the forward power into the crystal 24 minus the reflected power back into the RF generator 18.

The megasonic transducer 17 (or 16) is prepared as follows (using the preferred materials described previously):

Assuming that the energy transmitting member 28 is stainless steel, the surface of the stainless steel that will be adjacent to the layer 68 is cleaned by abrasive blasting or chemical or sputter etching. The blocking/adhesive layer 68 is then deposited on the stainless steel member 28 by argon sputtering ("PVD"). A plating technique could also be used. The silver layer 60 is then deposited on the chromium blocking/adhesive layer 68 using argon sputtering. A plating technique could also be used.

The piezoelectric crystal 24 is usually purchased with the metal layers 40 and 80 already applied to the sides 44 and 74, respectively, of the piezoelectric crystal 24. The blocking layer 56 and the metal layer 48 are deposited on the metal layer 40 by plating or physical vapor deposition.

The stainless steel energy transmitting member 28 and the piezoelectric crystal 24 are both heated to approximately 200° C., preferably by placing the member 28 and the crystal 24 on a hot-plate with the metal layers 60 and 48 facing up. When both pieces have reached a temperature of greater than 160° C., solid indium is rubbed on the surfaces of the member 28 and the crystal 24 which are to be attached (i.e. on the metal layers 60 and 48). Since pure indium melts at approximately 157° C., the solid indium liquefies when it is applied to the hot surfaces, thereby wetting the surfaces with indium. It is sometimes advantageous to add more indium at this time by using the surface tension of the indium to form a "puddle" of molten indium.

The stainless steel energy transmitting member 28 and the piezoelectric crystal 24 are then pressed together so that the surfaces coated with indium are in contact with each other thereby forming the transducer 17. The newly formed transducer 17 is allowed to cool to room temperature so that the indium solidifies. Preferably, the solid indium layer has a thickness "g" which is just sufficient to form a void free bond (i.e. the thinner the better). In the preferred embodiment, "g" is approximately one mil (0.001 inches). Thicknesses up to about 0.01 inches could be used, but the efficiency of acoustic transmission drops off when the thickness "g" is increased.

Preferably, the transducer 17 is allowed to cool with the piezoelectric crystal 24 on top of the energy transmitting member 28 and the force of gravity holding the two pieces together. Alternatively, a weight can be placed on top of the piezoelectric crystal 24 to aide in the bonding of the indium. Another alternative is to place the newly formed transducer 17 in a clamping fixture.

Once the transducer 17 has cooled to room temperature, any excess indium that has seeped out from between the piezoelectric crystal 24 and the energy transmitting member 28, is removed with a tool or other means. To complete the assembly process, the leads 19 and 20 are then attached to the transducer 17 so as to make the electrical connection described previously.

The transducer 17 functions as follows: The RF voltage supplied by the generator 18 creates a potential difference across the piezoelectric crystal 24 because the leads 20 and 19 deliver RF voltage to the surfaces 44 and 74. Since this an AC voltage, the crystal 24 expands and contracts at this frequency and emits acoustic energy. Preferably, the emitted acoustic energy is in the frequency range of ap proximately 925 MHz. However, acoustic energy in the frequency range of approximately 0.5 to 2.0 MHz can be used with the transducers 16 and 17, depending on their thickness and natural frequency.

Most of this acoustic energy is transmitted through all of the layers disposed between the surface 44 and the fluid 22 (i.e. layers 40, 56, 48, 32, 60, 68 and member 28) and is delivered into the fluid 22. However, some of the acoustic energy generated by the piezoelectric crystal 24 is reflected by some or all of these layers. This reflected energy can cause the layers to heat up, especially as the power to the crystal is increased.

In the present invention, the indium layer 32 has an acoustic impedance that is higher than the acoustic impedance of other attachment substances, such as epoxy. This reduces the amount of reflected acoustic energy between the energy transmitting member 28 and the indium layer 32. This creates two advantages in the present invention. First, less heat is generated in the transducer system, thereby allowing more RF power to be applied to the piezoelectric crystal 24. For example, in the present invention, 15 to 30 watts/$cm^2$ can be applied to the crystal 24 (for an individually excited crystal), whereas prior art systems use approximately 7 to 8 watts/$cm^2$.

Second, in the present invention, the reduced reflectance allows more power to be delivered into the fluid 22, thereby reducing the amount of time required in a cleaning cycle. For example, in the prior art, a cleaning cycle for sub 0.5 micron particles generally requires fifteen minutes of cleaning time. With the present invention, this time is reduced to less than one minute for many applications. In general, the use of the indium layer 32 permits at least 90 to 98% of the acoustic energy generated by the piezoelectric crystal 24 to be transmitted into the cleaning fluid 22 when the power applied to the piezoelectric crystal 24 is in the range of 400 to 1000 watts per unit area. In the preferred embodiment, the indium attachment layer 32 attenuates the acoustic energy that is transmitted into the volume of cleaning fluid by no more than approximately 0.5 dB. It is believed that the transducer 17 can be used with power as high as 5000 watts. In general, the application of higher power levels to the piezoelectric crystal 24 results in faster cleaning times. It may also lead to more thorough cleaning.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:

1. A megasonic cleaning system comprising:

a piezoelectric crystal for generating acoustic energy in the frequency range of 0.4 to 2.0 MHz when power is applied to the piezoelectric crystal;

an energy transmitting member adapted for positioning between the piezoelectric crystal and a volume of cleaning fluid; and an attachment layer comprised of indium positioned between the energy transmitting member and the piezoelectric crystal for attaching the piezoelectric crystal to the energy transmitting member, the attachment layer having an acoustic impedance that allows power of at least approximately 15 watts/$cm^2$ to be applied to the piezoelectric crystal.

2. A megasonic cleaning system comprising:

a piezoelectric crystal for generating acoustic energy in the frequency range of 0.4 to 2.0 MHz;

an energy transmitting member adapted for positioning between the piezoelectric crystal and a volume of cleaning fluid; and an attachment layer comprised of at least 99% pure indium positioned between the energy transmitting member and the piezoelectric crystal for attaching the piezoelectric crystal to the energy transmitting member.

3. The system of claim 2 wherein the energy transmitting member comprises a stainless steel plate.

4. The system of claim 2 wherein the energy transmitting member is selected from the group consisting of aluminum, silica compounds, ceramic materials and plastics.

5. The system of claim 2 wherein the piezoelectric crystal comprises lead zirconate titanate.

6. A megasonic cleaning system comprising:

an energy transmitting member comprised of stainless steel;

a piezoelectric crystal having a front surface that faces the energy transmitting member and a back surface that faces away from the energy transmitting member, the energy transmitting member being adapted for positioning between the piezoelectric crystal and a volume of cleaning fluid;

an attachment layer comprised of indium positioned between the energy transmitting member and the piezoelectric crystal for attaching the piezoelectric crystal to the energy transmitting member, the attachment layer having a first surface facing in the direction of the energy transmitting member and a second surface facing in the direction of the piezoelectric crystal;

a first metal layer positioned in contact with the first surface of the attachment layer;

a second metal layer positioned in contact with the second surface of the attachment layer;

a first blocking means for preventing the energy transmitting means from forming an alloy with the first metal layer, the first blocking means being positioned between the first metal layer and the energy transmitting member; and a third metal layer positioned in contact with the back surface of the piezoelectric crystal.

7. The system of claim 6 further comprising:

a fourth metal layer deposited on the front surface of the piezoelectric crystal; and a second blocking layer positioned between the attachment layer and the fourth metal layer.

8. The system of claim 6 wherein the attachment layer has a thickness in the range of approximately 0.010 to 0.001 inches.

9. The system of claim 6 wherein the first blocking means comprises a layer of chromium.

10. The system of claim 6 wherein the piezoelectric crystal comprises lead zirconium titanate.

11. The system of claim 6 wherein the first metal layer comprises silver.

12. The system of claim 11 wherein the first metal layer has a thickness in the range of approximately 5000 to 6000 Å.

13. The system of claim 6 wherein the second metal layer comprises silver.

14. The system of claim 6 wherein the third metal layer comprises silver.

15. The system of claim 7 wherein the fourth metal layer comprises silver.

16. The system of claim 7 wherein the second blocking layer comprises chromium.

* * * * *